(12) United States Patent
Salmon

(10) Patent No.: US 7,505,862 B2
(45) Date of Patent: Mar. 17, 2009

(54) APPARATUS AND METHOD FOR TESTING ELECTRONIC SYSTEMS

(75) Inventor: Peter C. Salmon, Mountain View, CA (US)

(73) Assignee: Salmon Technologies, LLC, Mountain View, CA (US)

(*) Notice: Subject to any disclaimer, the term of this patent is extended or adjusted under 35 U.S.C. 154(b) by 0 days.

(21) Appl. No.: 10/448,611

(22) Filed: May 29, 2003

(65) Prior Publication Data
US 2004/0176924 A1 Sep. 9, 2004

Related U.S. Application Data

(60) Provisional application No. 60/452,793, filed on Mar. 7, 2003.

(51) Int. Cl.
*G01M 19/00* (2006.01)
(52) U.S. Cl. .................................................... 702/125
(58) Field of Classification Search ................ 702/125, 702/117, 119; 375/224; 714/28, 733, 726; 703/22
See application file for complete search history.

(56) References Cited

U.S. PATENT DOCUMENTS

| | | | | |
|---|---|---|---|---|
| 4,455,654 A | * | 6/1984 | Bhaskar et al. ................ 714/28 |
| 4,748,495 A | | 5/1988 | Kucharek .................... 257/713 |
| 4,862,322 A | | 8/1989 | Bickford et al. ............. 361/718 |
| 4,912,844 A | | 4/1990 | Parker .......................... 29/848 |
| 5,001,548 A | | 3/1991 | Iversen ........................ 257/714 |
| 5,159,529 A | | 10/1992 | Lovgren ...................... 361/699 |
| 5,162,974 A | | 11/1992 | Currie .......................... 361/702 |
| 5,214,250 A | | 5/1993 | Cayson et al. ................. 438/73 |
| 5,239,200 A | | 8/1993 | Messina et al. .............. 257/714 |
| 5,239,448 A | | 8/1993 | Perkins et al. ............... 361/764 |
| 5,267,867 A | | 12/1993 | Agahdel et al. ................ 439/73 |
| 5,281,151 A | | 1/1994 | Arima et al. ................... 439/68 |
| 5,290,970 A | | 3/1994 | Currie .......................... 174/250 |
| 5,291,064 A | | 3/1994 | Kurokawa .................... 257/714 |
| 5,305,184 A | | 4/1994 | Andresen et al. ............. 361/699 |

(Continued)

FOREIGN PATENT DOCUMENTS

JP 07169873 A 7/1995

OTHER PUBLICATIONS

Dann Gustavson, "New Test Methods and Their Impact on Design", Printed Circuit Design, Jun. 2002, pp. 8-11 and p. 35.

(Continued)

*Primary Examiner*—Tung S Lau
*Assistant Examiner*—Xiuquin Sun
(74) *Attorney, Agent, or Firm*—Dorsey & Whitney LLP

(57) ABSTRACT

The technology and economics of system testing have evolved to the point where a radical change in methodology is needed for effective functional testing of systems at clock rates of 1 GHz and higher. Rather than providing a test fixture to interface between the system under test and an external tester, it is preferable to provide critical testing functions within each electronic system in the form of one or more special-purpose test chips. An architecture is proposed that supports full-speed testing with improved noise margins, and also efficient methods for learning correct system behavior and generating the test vectors. The test program is preferably written using the same programming language as used for the system application.

14 Claims, 2 Drawing Sheets

U.S. PATENT DOCUMENTS

| | | | | |
|---|---|---|---|---|
| 5,334,279 | A | 8/1994 | Gregoire | 216/20 |
| 5,367,593 | A | 11/1994 | Lebby et al. | 385/53 |
| 5,390,412 | A | 2/1995 | Gregoire | 29/848 |
| 5,451,722 | A | 9/1995 | Gregoire | 174/261 |
| 5,510,758 | A | 4/1996 | Fujita et al. | 333/247 |
| 5,579,574 | A | 12/1996 | Colleran et al. | 29/840 |
| 5,627,406 | A | 5/1997 | Pace | 257/700 |
| 5,635,767 | A | 6/1997 | Wenzel et al. | 257/778 |
| 5,640,051 | A | 6/1997 | Tomura et al. | 257/778 |
| 5,774,475 | A * | 6/1998 | Qureshi | 714/726 |
| 5,800,060 | A | 9/1998 | Speckbrock et al. | 374/104 |
| 5,847,936 | A | 12/1998 | Forehand et al. | 361/794 |
| 5,900,738 | A | 5/1999 | Khandros et al. | 324/761 |
| 5,972,152 | A | 10/1999 | Lake et al. | 156/247 |
| 5,998,738 | A | 12/1999 | Li et al. | 174/250 |
| 6,005,198 | A | 12/1999 | Gregoire | 174/262 |
| 6,103,554 | A | 8/2000 | Son et al. | 438/126 |
| 6,121,676 | A | 9/2000 | Solberg | 257/686 |
| 6,138,348 | A | 10/2000 | Kulesza et al. | 29/840 |
| 6,174,804 | B1 | 1/2001 | Hsu | 438/238 |
| 6,208,511 | B1 | 3/2001 | Bortolini et al. | 361/698 |
| 6,225,688 | B1 | 5/2001 | Kim et al. | 257/686 |
| 6,246,010 | B1 | 6/2001 | Zenner et al. | 174/260 |
| 6,304,447 | B1 | 10/2001 | Bortolini et al. | 361/699 |
| 6,310,484 | B1 | 10/2001 | Akram et al. | 324/764 |
| 6,372,549 | B2 | 4/2002 | Urushima | 438/118 |
| 6,392,301 | B1 | 5/2002 | Waizman et al. | 257/774 |
| 6,441,476 | B1 | 8/2002 | Emoto | 257/686 |
| 6,460,247 | B1 | 10/2002 | Gregoire | 29/848 |
| 6,515,870 | B1 | 2/2003 | Skinner et al. | 361/800 |
| 6,528,891 | B2 | 3/2003 | Lin et al. | 257/778 |
| 6,587,345 | B2 | 7/2003 | Chu et al. | 361/719 |
| 6,631,344 | B1 * | 10/2003 | Kapur et al. | 703/22 |
| 6,683,377 | B1 | 1/2004 | Shim et al. | 257/723 |
| 6,722,893 | B2 | 4/2004 | Li et al. | 439/66 |
| 6,763,880 | B1 | 7/2004 | Shih | 165/80.4 |
| 6,784,554 | B2 | 8/2004 | Kajiwara et al. | 257/778 |
| 6,845,477 | B2 | 1/2005 | Hidaka | 714/729 |
| 6,881,609 | B2 | 4/2005 | Salmon | 438/107 |
| 6,891,732 | B2 | 5/2005 | Takano et al. | 361/783 |
| 6,927,471 | B2 | 8/2005 | Salmon | 257/499 |
| 6,938,678 | B1 | 9/2005 | Bortolini et al. | 165/80.4 |
| 6,942,493 | B2 | 9/2005 | Matsunaga et al. | 439/66 |
| 6,955,063 | B2 | 10/2005 | Adiga et al. | 62/259.2 |
| 6,956,284 | B2 | 10/2005 | Cady et al. | 257/685 |
| 6,956,285 | B2 | 10/2005 | Radu et al. | 257/697 |
| 6,973,717 | B2 | 12/2005 | Hacke et al. | 29/840 |
| 6,990,176 | B2 | 1/2006 | Sherman et al. | 378/98.8 |
| 7,009,412 | B2 | 3/2006 | Chong et al. | 324/754 |
| 7,040,383 | B2 | 5/2006 | Oyamada | 165/104.33 |
| 7,078,926 | B2 | 7/2006 | Khandros et al. | 324/765 |
| 7,163,830 | B2 | 1/2007 | Salmon et al. | 438/18 |
| 7,254,024 | B2 | 8/2007 | Salmon | 361/699 |
| 2002/0030975 | A1 | 3/2002 | Moon | 361/749 |
| 2002/0121689 | A1 | 9/2002 | Honda | 257/700 |
| 2003/0035473 | A1 * | 2/2003 | Takinosawa | 375/224 |
| 2003/0106004 | A1 * | 6/2003 | Ricchetti et al. | 714/733 |
| 2003/0167144 | A1 * | 9/2003 | Wang et al. | 702/119 |
| 2003/0168725 | A1 | 9/2003 | Warner et al. | 257/686 |
| 2004/0148121 | A1 * | 7/2004 | de Obaldia et al. | 702/117 |
| 2005/0040513 | A1 | 2/2005 | Salmon | 257/734 |
| 2005/0184376 | A1 | 8/2005 | Salmon | 257/686 |
| 2005/0255722 | A1 | 11/2005 | Salmon | 439/67 |
| 2006/0077638 | A1 | 4/2006 | Salmon | 361/704 |
| 2006/0131728 | A1 | 6/2006 | Salmon | 257/698 |
| 2006/0209512 | A1 | 9/2006 | Taniguchi et al. | 361/699 |
| 2007/0023889 | A1 | 2/2007 | Salmon | 257/690 |
| 2007/0023904 | A1 | 2/2007 | Salmon | 385/49 |
| 2007/0023923 | A1 | 2/2007 | Salmon | 257/296 |
| 2007/0025079 | A1 | 2/2007 | Salmon | 361/699 |

OTHER PUBLICATIONS

Chow, Eugene M. et al., "Process Compatible Polysilicon-Based Electrical Through-Wafer Interconnects in Silicon Substrates", Journal of Microelectromechanical Systems, vol. 11, No. 6, Dec. 2002, pp. 631-640.

Davis & Arledge, "Thin Film Metallization of Three Dimensional Substrates", Electronic Components Technology Conference, Proceedings 44th, May 1-4, 1994, pp. 359-361 (Abstract only).

Gutmann, R.J. et al., "Wafer-Level Three-Dimensional Ics: A Better Solution Than SoCs and SiPs?", 6 pages.

Holden, Happy, "A Design Technology Innovation—The Power Mesh Architecture for PCBs", The Board Authority, Dec. 2000, pp. 2-6.

Sensu, Yoshihisa et al., "Study on Improved Resolution of Thick Film Resist (Verification by Simulation)", SPIE, 2001.

* cited by examiner

APPARATUS AND METHOD FOR TESTING ELECTRONIC SYSTEMS

RELATED APPLICATIONS

This application claims priority to provisional Application Ser. No. 60/452,793 filed Mar. 7, 2003.

BRIEF DESCRIPTION OF THE INVENTION

This invention relates to apparatus and method for testing electronic systems, and more particularly to apparatus and method for functionally testing electronic systems at clock rates of 1 GHz and higher.

BACKGROUND OF THE INVENTION

Conventional test methods include a hierarchy of tests including wafer probe testing, packaged part testing, and system testing. In each of these, it is customary to use a test fixture between the device under test, DUT, and the tester. The test fixture normally includes a switch matrix for connecting tester pins to DUT pins, and a collection of driver and receiver circuits, switches and relays that are commonly referred to as the "pin electronics" of the tester.

In digital systems, clock rates have increased to 1 GHz and beyond. At high frequencies it becomes desirable to place components close together, and minimize trace lengths. To this end, systems have been produced that employ bare IC chips rather than packaged parts, with the IC chips attached to the system board using flip chip bonding methods, resulting in dense systems and short trace lengths. It is similarly desirable to minimize the electrical path lengths between a system under test, SUT, and the comparator circuits that are used to verify system behavior.

Conventional testing methods provide a hierarchy of inspections and tests for testing complex systems. Automatic optical inspection, AOI, employs cameras and lighting systems to examine board assemblies for correct component placement and orientation, acceptable traces and solder joints. Automated X-ray inspection, AXI, can check solder joints that are hidden from AOI equipment. In circuit test, ICT, is often employed to measure values of discrete components, and to find open and short circuits. The fixture for ICT is typically a grid of electronic probes (or "bed of nails") that make contact with test points designed into the board assembly. The maximum number of nodes that can be tested using ICT is currently around 7,000. Complex system boards may have 10,000 nodes and upward. Boundary scan is a test method commonly used to check that all components are present and properly oriented. Boundary scan methods add logic and control signals to each component, internal blocks are chained together, and access to internal nodes is greatly improved. After all the passive elements of the system have been verified and boundary scan has been performed, a board functional test is typically required. Normally, a test fixture is used to connect system nodes to tester nodes. With the system under power, stimulus vectors are applied while system outputs are measured for the correct values. A lot of effort is required to determine the stimulus vectors and the correct system responses, and the effort increases as system complexity increases. For some complex systems this approach is abandoned because the time and effort are judged to be too great. In these cases, less rigorous testing may be accomplished using a "hot mockup" which is a version of the end-user system, or by using system equivalency tests. These methods are weak in terms of diagnosing problems, because only system level results are accessible.

Recent test fixtures have included expensive GaAs circuits for increased switching speed and electro-optical receivers for isolation between test circuits. Despite these efforts, some systems cannot be tested at full speed and others have to compromise on test coverage to keep the test time within reasonable bounds.

Recent advances in high-density interconnection (HDI), circuits, and in flip chip bonding techniques have made it possible to add additional IC chips to a system board at a low assembly cost. Also, advances in IC chip design and implementation make it possible to include most or all of the functions of a sophisticated tester on a single IC chip, especially if the pin electronics are simplified.

Built in self test (BIST) is a methodology that has been developed for testing individual components by providing test circuits within the component, rather than connecting them to an external tester. TOB is similar in concept, except that the test target is a system board rather than a component of that board.

SUMMARY OF THE INVENTION

The proposed test method, tester on board (TOB), performs the system functional test with most of the tester functionality implemented on an IC test chip that is placed on the system board. The test chip is connected to system nodes using the interconnection method of the system board; preferably the components are assembled as bare die using flip chip assembly methods. Since in circuit tests and boundary scans are typically low speed tests employing simple test hardware, they are preferably provided by a test support computer that includes such hardware, without involving the IC test chip.

In the preferred embodiment, a single test chip samples test signals of three different types: digital, analog, and radio frequency (RF). The digital signals are carried on digital bus lines, the analog signals are carried on analog bus lines, and the RF signals are sampled at antenna inputs. System behavior is evidenced by the various signals sampled and tested at the discrete instants in time represented by test cycles. The ultimate format for each item of captured behavior is preferably a test vector or digital word, although analog comparisons may be preferred for parametric tests such as a leakage current test. The main focus of this application applies to functional testing of digitized signals. However, reference sources including voltage and current sources, amplifiers and analog comparators may be included in the preferred test hardware for parametric testing. For digital signals the number of bits in the word corresponds to the number of digital bits sampled. Analog test signals are preferably converted from analog to digital format; the number of bits in each analog test vector is calculated as the number of analog signals sampled times the number of digitized bits per sample. RF test signals may be down-converted to a suitable intermediate frequency, then demodulated and digitized. The number of bits in each RF test vector is equal to the number of RF signals sampled times the number of digitized bits per sample.

The test system includes a learn mode and a test mode. The learn mode allows test vectors generated during selected cycles of system behavior to be automatically accumulated in memory. These vectors can be created by a reference system that is hopefully fully functional, or close to fully functional. The cycles selected are test cycles; they capture critical system behaviors or responses. Eliminating redundant or unnecessary test cycles has the benefit of reducing the required amount of memory on the test chip. The test program starts at time=0 with cycle count=0. The cycle count increments with each cycle of the timing reference or system clock. The temporal locations of selected cycles (cycle counts) are captured in a test mask which includes a memory bit for each test cycle performed. A "1" in the mask memory represents a selected cycle for which verification is required (a test cycle); a "0" represents an unselected cycle for which verification is not required. Typically, only a small percentage of total system cycles are required to be test cycles in order to reliably validate system behavior.

Successive approximations are employed to capture and refine the learned behavior of a properly functioning system. The goal is to automate the process where possible, avoid writing a detailed test program in a software language foreign to the system designers, and reduce the amount of labor required to optimize the selection of effective test vectors. After the learned behavior is refined and verified, the test vectors become proven test vectors; they can be loaded into reference memories for comparison with observed behavior of a system under test (SUT).

A test support computer stores a master copy of the test program, a master copy of the test mask memory, and a complete set of proven test vectors. These are loaded into the appropriate memories before testing commences. A test is performed by running the test program and comparing test vectors generated by the SUT against the proven test vectors. Any mismatch raises a flag which is reported at a given test cycle count. The test result is passed to the test support computer which diagnoses potential causes of any flagged mismatches, and displays recommendations to the test operator for reworking defective components in the system.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
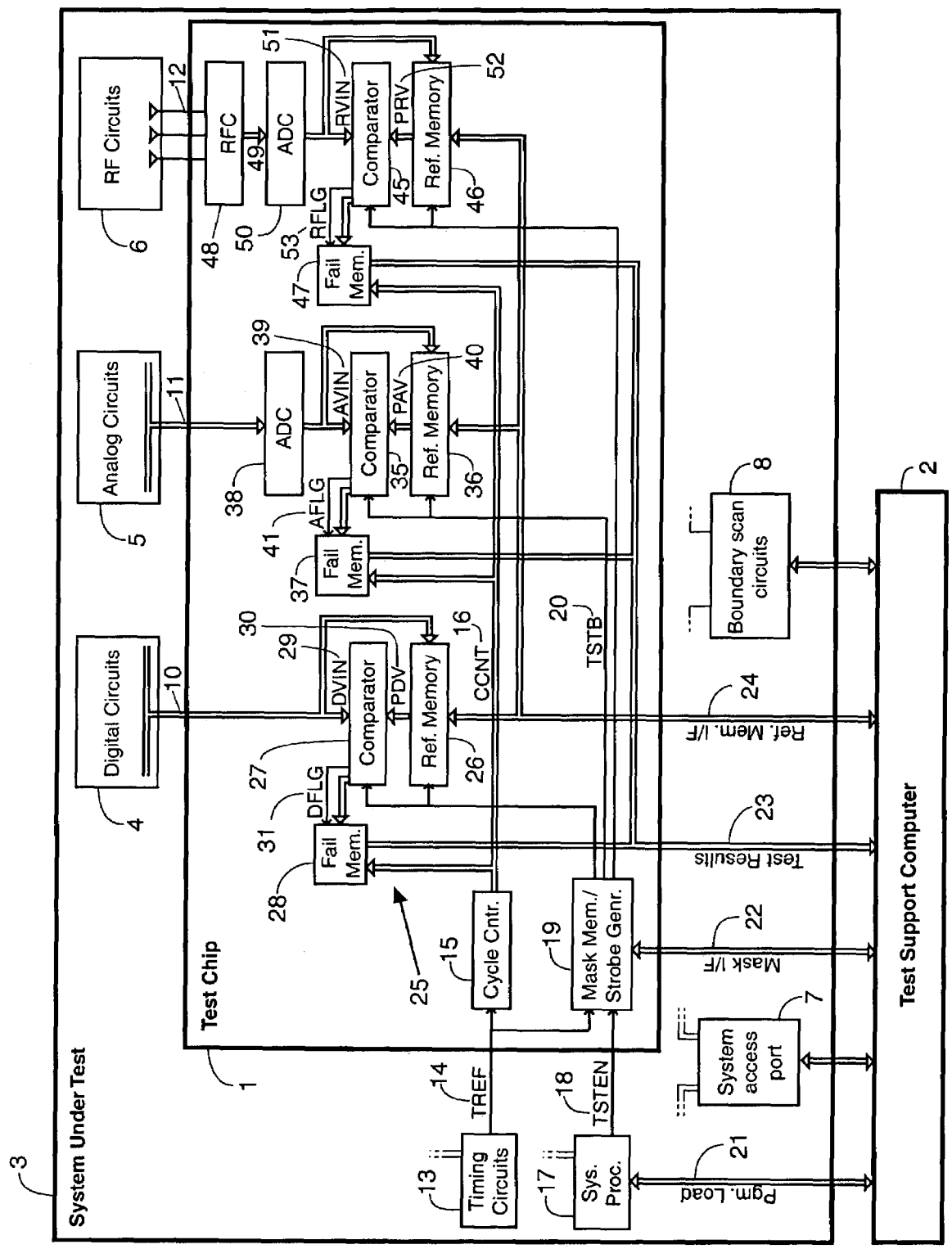
FIG. 1 is a high level block diagram of the test system of the current invention, showing primary data and control flows.

FIG. 1 shows a high-level block diagram of a test apparatus of the current invention including a test chip 1 and a test support computer 2 connected to the system under test (SUT) 3. SUT 3 includes digital circuits 4, analog circuits 5, and RF circuits 6. System access port 7 is preferably a high-density connection between SUT 3 and test support computer 2. This port is preferably used to validate the interconnection circuits of the SUT using continuity-testing circuits typically provided on a plug-in board within test support computer 2. Similarly, another plug-in board within test support computer 2 may include circuits for testing boundary scan circuits 8 of SUT 3. Plug-in boards can be used for these tests because the clock rates are typically slower than for functional testing; the test hardware is less demanding and is typically available as a commercial-off-the-shelf (COTS) item. Also, connecting wires or cables can be tolerated at the lower test frequencies. In combination, the continuity and boundary scan tests validate the integrity of the conductive traces and also the placement and orientation of components mounted on the system board. The rest of this description will focus on the more challenging task of functionally testing the SUT at clock rates of 1 GHz and higher.

Three signal types are tested by test chip 1 in the preferred embodiment. Digital input bus 10 is a collection of digital signals bussed to input pads and input buffers (not shown) of test chip 1. Similarly analog input bus 11 is a collection of analog signals bussed to test chip 1. RF inputs 12 are collected at one or more antenna sites on the SUT as shown. Preferably, signals of each type are routed in a manner that protects them from electrical noise sources in the system, typically by providing spatial separation between circuit blocks of different types, and among the signals of a given type.

Timing circuits 13 on the SUT provide a timing reference (TREF) 14. In a digital system employing synchronous design TREF 14 may be a digital system clock, with one system cycle represented by one period of the system clock. This is the most common type of system and for the purpose of illustration this is the type of system discussed herein. However, asynchronous designs and other timing methods are possible and are included within the scope of the present invention. TREF 14 is an input to cycle counter 15 which increments every system cycle, and provides a pointer (CCNT) 16 to every system cycle within a test program.

As a preferred first step in the process of learning correct system behavior, an application program that would run in system processor 17 is augmented with additional instructions to produce a test program. This is a convenient way to generate the first draft of the test program. The application software is typically written in a high level language; both the software and the program language are usually familiar to the system developers. The program is written to thoroughly exercise all of the features and components of the system. It is augmented with additional instructions that generate a test enable signal (TSTEN) 18 to highlight critical system cycles whenever it is judged that system behavior should be captured and tested. The behavior is preferably captured in test vectors. An example of a critical system cycle would be an instruction to read a register in a system component containing a digital variable that has just been calculated or has otherwise just changed to reflect a new result. The selected cycles are combined with TREF 14 to produce a mask memory 19 and also to generate test strobes such as TSTB 20. The mask memory is a serial memory that contains a 1 for system cycles that are selected as test cycles, and a 0 for all other cycles. In practice the sampling circuits may operate continuously, with only a few of the samples tested. We shall define "sample and test" as a unified sequence that includes both sampling and testing of the sampled input. System behavior is only sampled and tested during test cycles, which are typically a small fraction, perhaps 1% of the total system cycles. Similarly a test strobe 20 is generated only during test cycles, and is referenced to TREF 14. This preliminary process for generating test vectors may be imprecise because the instruction used to generate TSTEN 18 typically occupies several system cycles. Consequently, too many 1s may be placed in mask memory. However, a test program developer can easily scan these sequences and cull the number of 1s to create an optimal set. This refinement of the mask memory is typically performed using software running on test support computer 2.

A bi-directional bus interface 21 is provided between test support computer 2 and system processor 17. Interface 21 is used for general communications such as may be required for synchronization, and also for passing test programs and augmented test programs back and forth between SUT 3 and test support computer 2.

After the first phase of selecting critical test cycles is complete as outlined above, a preliminary version of mask memory 19 is available in test chip 1. Bi-directional interface 22 allows the mask image to be passed back and forth between mask memory 19 and test support computer 2 as it is successively refined and tested.

Other interfaces to test support computer 2 include results bus 23 for reporting test results from the fail memories, and a bi-directional interface 24 to the reference memories. As will be described, the reference memories contain proven test vectors used for comparison with system outputs. As with the test program and the mask memory, it is desirable to pass the contents of the reference memories in and out of test support computer 2 during the process of refining them.

We shall first examine testing of system behavior represented by digital signals. A core logic block 25 on test chip 1 includes a reference memory 26, a digital comparator 27, and a fail memory 28. Digital input bus 10 is sampled to form a test vector, DVIN, 29 at one input to comparator 27. The number of bits in test vector DVIN 29 corresponds to the number of digital bits sampled. During test mode, the other input to comparator 27 is provided by reference memory 26 in the form of a proven digital test vector, PDV 30. During learn mode, digital inputs 10 are sampled and captured in reference memory 26. If the SUT is fully functional, then the learned test vectors will indicate correct system behavior. This method of learning the correct system behavior can eliminate a lot of work in generating and validating the test vectors by simulation or other means.

Multiple system prototypes may be used to generate the learned behavior; some will contribute only a portion of the total behavior, others will be used to statistically validate the learned responses. The learned test vectors are transferred to test support computer 2 where they are assembled and saved in a memory block comprising a full set of digital test vectors. For a given test cycle, if the compared vectors DVIN and PDV are the same, then no error flag is raised and no entries are written to fail memory 28. Conversely, if the two vectors are not the same, comparator 27 will send an error flag for digital signals, DFLG, 31 to fail memory 28. DFLG 31 will cause CCNT 16 to be saved in fail memory 28 as a pointer to a failed test cycle. It is preferable to store in fail memory 28 the value of CCNT when the failure occurred, plus all the bits of the comparison vector. At least one of these bits will be a zero to indicate that a failure occurred. The location of 0's within the comparison vector may be used by diagnostic software hosted in test support computer 2 to help determine the specific failing component or components, to support subsequent recommendations to the test operator about which components need to be replaced.

An alternative embodiment of the test architecture will provide the comparison test vector in the appropriate reference memory by sampling a second operating system with known good behavior. The critical requirement is that a known good test vector be provided at the instant of comparison, whether it is predetermined and loaded into reference memory or provided by a parallel operating system.

Next we shall examine testing of system behavior represented by analog signals. The same core logic block 25 is used in the test path for analog inputs 11, enumerated as digital comparator 35, reference memory 36, and fail memory 37. An analog to digital converter, ADC, 38 digitizes each waveform of the sampled data and concatenates the digitized words to form a test vector, AVIN, 39. Again, system behavior can be learned by loading sampled and digitized analog inputs into reference memory 36 and then reading the digital words into test support computer 2, to create a memory block comprising a full set of analog test vectors. In test mode however, reference memory 36 has been pre-loaded with known good or proven test vectors from test support computer 2. If a digital comparison produces a mismatch between test vector AVIN 39. and proven test vector PAV 40, error flag AFLG 41 for analog signals is sent to fail memory 37.

Next we shall examine testing of system behavior represented by RF signals. The same core logic block 25 is used in the test path for radio frequency inputs 12, enumerated as digital comparator 45, reference memory 46, and fail memory 47. An RF converter, RFC, down-converts each RF signal to a suitable intermediate frequency, IF, and demodulates the signal. The parallel stream of demodulated signals 49 is digitized by analog to digital converter, ADC, 50, and the digitized words are concatenated to form test vector, RVIN, 51. Again, system behavior can be learned by loading sampled and digitized RF inputs into reference memory 46 and then reading the digital words into test support computer 2, to create a memory block comprising a full set of RF test vectors. In test mode however, reference memory 46 has been pre-loaded with known good or proven test vectors from test support computer 2. If a digital comparison produces a mismatch between test vector RVIN 51 and proven test vector PRV 52, error flag RFLG 53 for RF signals is sent to fail memory 47.

Figure 2:
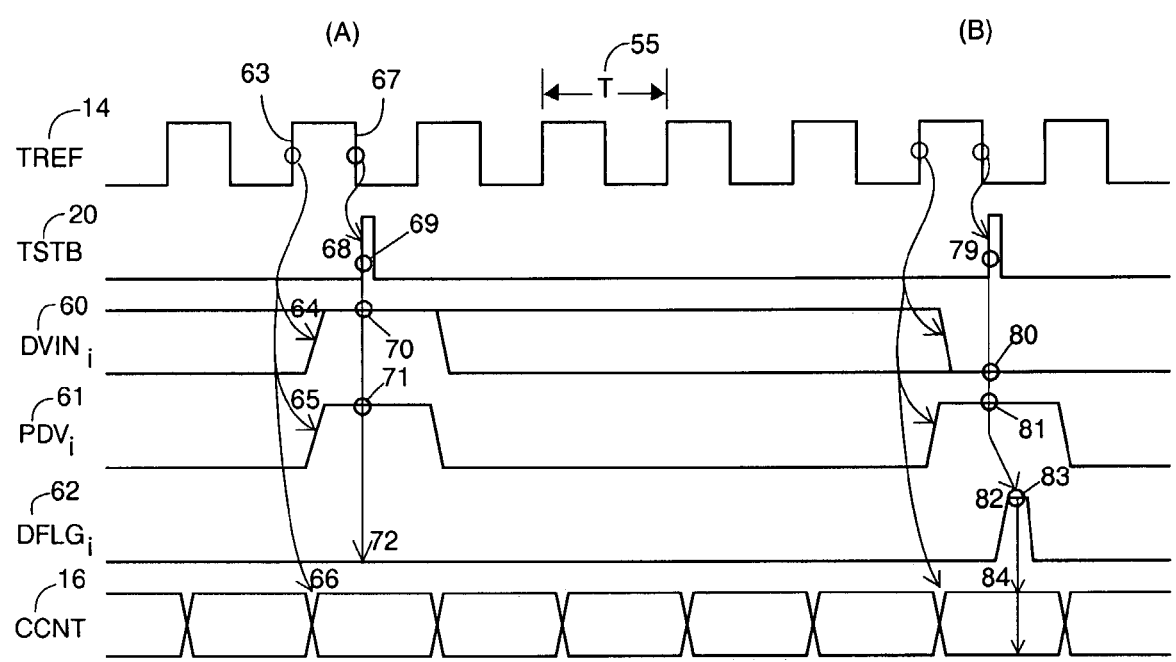
FIG. 2 is a timing diagram showing representative test signal waveforms for both a passing and a failing test event.

FIG. 2 shows representative timing of both a passing test event [designated "(A)"] and a failing test event [designated "(B)"]. Waveforms are presented with voltage on the vertical axis and time on the horizontal axis. The timings are shown for a digital input signal and represent just one possible example of how the various edges of TREF could be used to generate test control signals. Since in the preferred embodiment analog and RF signals are converted to digital signals in test chip 1 prior to the comparison event, a similar timing diagram would apply for those signal types as well. TREF 14 is the timing reference previously discussed. It has a system cycle time, T, 55 as shown. TSTB 20 is the test strobe previously discussed. $DVIN_i$ 60 is one bit of a digital test vector that has been sampled from digital input bus 10. $PDV_i$ 61 is the corresponding bit of a known good or proven test vector for comparison with $DVIN_i$ 60. $DFLG_i$ 62 is the flag used to indicate a failure in bit i of the comparison word, and CCNT 16 is the cycle count. CCNT 16 increments for every system cycle T, 55. Sequence (A) in FIG. 2 is for a passing test event. A rising edge 63 of TREF causes transition 64 in $DVIN_i$, because the sampled digital signal is high during this test cycle. The compared value $PDV_i$ also transitions 65 to a high because the corresponding ith bit of the proven test vector in reference memory 26 is high. CCNT also switches, 66, in response to rising edge 63 of TREF. The following trailing edge of TREF 67 causes a positive transition 68 in TSTB as shown. TSTB activates the comparison of level 70 of $DVIN_i$ with level 71 of $PDV_i$. Since the compared levels are the same, indicating correct system behavior, $DFLG_i$ remains low 72, and the corresponding value of CCNT is not saved in fail memory 28. Conversely, sequence (B) in FIG. 2 is for a failing test event. The waveforms are similar to those depicted for sequence (A) except for $DVIN_i$ and $DFLG_i$. The sampled test vector bit $DVIN_i$ is low when it should be high. Thus at edge 79 of TSTB the compared levels 80 of $DVIN_i$ and 81 of $PDV_i$ are not the same. This causes $DFLG_i$ to transition high 82 which in turn causes the value of CCNT 84 to be captured in fail memory 28, along with the comparison vector having 0's for the failed bit locations.

What is claimed is:

1. A method for testing behavior of an electronic system having a system processor mounted on a system board and a system bus comprising:
   providing a test chip that is mounted on the system board;
   executing system cycles in accordance with a test program running on the system processor to provide system signals on the system bus;
   sampling multiple bits of the system bus directly and in parallel to obtain sampled system signals during at least one of the system cycles, the act of sampling multiple bits of the system bus including generating a test vector having a number of bits equal to the number of multiple bits sampled;
   comparing in the test chip the sampled system signals with signals representing known good behavior,
   the act of comparing the sampled signals including receiving a proven test vector representing the known good behavior and having the number of bits and conducting a parallel comparison of the multiple bits of the test vector and the multiple bits of the proven test vector;
   sending results of the comparisons to a test support computer; and
   acting on at least one result in accordance with whether the comparison indicates good or bad system behavior.

2. The method of claim 1 wherein the signals representing known good system behavior are provided by a second system operating in parallel with the system under test.

3. The method of claim 1 wherein the test chip includes a comparator and wherein the comparing step includes comparing the sampled system signals representing system behavior with signals representing known good behavior using the comparator.

4. The method of claim 1 wherein the known good system behavior is learned by capturing and storing behavior of a correctly functioning system.

5. The method of claim 1 wherein the system has application software and the test program is written in the same programming language as the application software.

6. A method according to claim 1 wherein the test chip is an integral part of the system.

7. A method according to claim 1 wherein the sampling step includes accessing the system bus free of an external cable.

8. A method according to claim 1 wherein the sampling step includes accessing the system bus free of an externally-accessible socket.

9. A method according to claim 1 wherein the sampling step includes accessing the system bus free of externally-accessible test probes.

10. A method according to claim 1 wherein the sampling step occurs at a system speed.

11. A method according to claim 10 wherein the system speed is 1 GHz or higher.

12. An electronic system comprising:
    a system board having a processor mounted on the system board and a system bus on the system board and coupled to the system processor; and
    at least one test chip mounted on the system board;
    the at least one test chip including:
       parallel sampling circuits coupled to the system bus to capture signals representing system behavior in a system cycle of the system, the parallel sampling circuits coupled to sample multiple bits of the system bus and generate a test vector having multiple bits;
       comparator circuits coupled to the sampling circuits in a parallel manner for comparing the captured signals representing system behavior in the system cycle with stored signals representing known good behavior of the system, the comparator circuits operable to compare the multiple bits of the test vector in parallel with multiple bits of a proven test vector representing known good behavior; and
    a mask memory coupled to the comparator circuits and configured to provide that the comparing of the captured signals with stored signals occurs in selected system cycles.

13. The system of claim 12 wherein the at least one test chip includes fail memory means coupled to the comparator circuits for storing failed comparisons.

14. The system of claim 12 further comprising at least one support computer external of the electronic system and electrically coupled to the at least one test chip.

* * * * *